(12) United States Patent
Dawson-Elli et al.

(10) Patent No.: US 9,387,648 B2
(45) Date of Patent: *Jul. 12, 2016

(54) GLASS LAMINATED ARTICLES AND LAYERED ARTICLES

(71) Applicant: CORNING INCORPORATED, Corning, NY (US)

(72) Inventors: David Francis Dawson-Elli, Elmira, NY (US); Steven Edward DeMartino, Painted Post, NY (US); Laura Lee Hluck, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/474,820

(22) Filed: Sep. 2, 2014

(65) Prior Publication Data

US 2014/0370257 A1 Dec. 18, 2014

Related U.S. Application Data

(63) Continuation of application No. 12/427,397, filed on Apr. 21, 2009.

(60) Provisional application No. 61/057,344, filed on May 30, 2008.

(51) Int. Cl.
*B32B 7/02* (2006.01)
*B29C 65/00* (2006.01)
*G02F 1/153* (2006.01)
*B32B 17/10* (2006.01)
*B32B 37/14* (2006.01)
*B32B 38/00* (2006.01)

(52) U.S. Cl.
CPC ............... *B32B 7/02* (2013.01); *B32B 17/101* (2013.01); *B32B 17/10036* (2013.01); *B32B 17/10091* (2013.01); *B32B 17/10761* (2013.01); *B32B 37/14* (2013.01); *B32B 38/0004* (2013.01); *G02F 1/153* (2013.01); *G02F 2202/09* (2013.01); *Y10T 428/2495* (2015.01); *Y10T 428/24967* (2015.01); *Y10T 428/26* (2015.01)

(58) Field of Classification Search
None
See application file for complete search history.

(56) References Cited

U.S. PATENT DOCUMENTS

| 3,646,440 A | 2/1972 | ***Wilhelm | 161/166 |
| 3,649,311 A * | 3/1972 | Araujo | 501/56 |
| 4,102,664 A | 7/1978 | Dumbaugh, Jr. | 65/23 |
| 4,187,226 A | 2/1980 | ***Patsch | 428/34 |
| 4,239,555 A | 12/1980 | Scharlack et al. | 136/251 |

(Continued)

FOREIGN PATENT DOCUMENTS

| CN | 2590732 Y | 12/2003 |
| DE | 10164273 | 7/2003 |

(Continued)

OTHER PUBLICATIONS

Taiwan Patent Application No. 098117929 Search Report.

(Continued)

*Primary Examiner* — David Sample
*Assistant Examiner* — Nicole T Gugliotta
(74) *Attorney, Agent, or Firm* — Jason Barron

(57) ABSTRACT

Laminated articles and layered articles, for example, low alkali glass laminated articles and layered articles useful for, for example, electrochromic devices are described.

26 Claims, 1 Drawing Sheet

(56) References Cited

U.S. PATENT DOCUMENTS

| | | | |
|---|---|---|---|
| 4,554,259 A | 11/1985 | Franklin et al. | 501/67 |
| 4,571,446 A | 2/1986 | Yamazaki | 136/244 |
| 4,625,070 A | 11/1986 | Berman et al. | 136/249 |
| 4,814,297 A | 3/1989 | Beall et al. | 501/7 |
| 4,832,755 A | 5/1989 | Barton et al. | 136/251 |
| 4,870,034 A | 9/1989 | Kiefer | 501/66 |
| 5,059,254 A | 10/1991 | Yaba et al. | 136/251 |
| 5,264,286 A | 11/1993 | Ando et al. | 428/432 |
| 5,321,544 A | 6/1994 | Parkhe et al. | 359/273 |
| 5,353,148 A | 10/1994 | Eid et al. | 359/265 |
| 5,384,653 A * | 1/1995 | Benson | G02F 1/153 359/265 |
| 5,408,353 A | 4/1995 | Nichols et al. | |
| 5,481,395 A | 1/1996 | Byker | |
| 5,500,759 A | 3/1996 | Coleman | |
| 5,506,180 A | 4/1996 | Ponthieu | 501/66 |
| 5,578,533 A * | 11/1996 | Manabe et al. | 501/17 |
| 5,589,272 A | 12/1996 | Braun et al. | |
| 5,608,567 A | 3/1997 | Grupp | |
| 5,640,274 A | 6/1997 | Iwama et al. | |
| 5,657,149 A | 8/1997 | Buffat et al. | |
| 5,721,633 A | 2/1998 | Nagai et al. | |
| 5,729,379 A | 3/1998 | Allemand et al. | |
| 5,737,114 A | 4/1998 | Bailey | |
| 5,763,050 A | 6/1998 | Hirmer | |
| 5,798,860 A | 8/1998 | Yu et al. | |
| 5,825,526 A | 10/1998 | Bommarito et al. | |
| 5,959,762 A | 9/1999 | Bandettini et al. | |
| 5,985,486 A | 11/1999 | Giron | |
| 6,005,705 A | 12/1999 | Schmidt et al. | 359/265 |
| 6,033,518 A | 3/2000 | Backfisch | |
| 6,055,088 A | 4/2000 | Fix et al. | |
| 6,060,168 A | 5/2000 | Kohli | 428/428 |
| 6,061,177 A | 5/2000 | Fujimoto | 359/443 |
| 6,160,655 A | 12/2000 | Fix et al. | |
| 6,178,034 B1 | 1/2001 | Allemand et al. | |
| 6,204,953 B1 | 3/2001 | Zieba et al. | |
| 6,248,948 B1 | 6/2001 | Nakagawa et al. | 136/244 |
| 6,259,549 B1 | 7/2001 | Leupolz et al. | |
| 6,280,041 B1 | 8/2001 | Unger et al. | |
| 6,285,486 B1 | 9/2001 | Kobayashi et al. | |
| 6,287,674 B1 | 9/2001 | Verlinden et al. | 428/210 |
| 6,313,052 B1 | 11/2001 | Nakashima et al. | 501/69 |
| 6,329,061 B2 | 12/2001 | Kondo | 428/432 |
| 6,329,310 B1 | 12/2001 | Peuchert et al. | 501/66 |
| 6,429,961 B1 | 8/2002 | Harary et al. | |
| 6,535,126 B2 | 3/2003 | Lin et al. | |
| 6,572,990 B1 | 6/2003 | Oyama et al. | 428/698 |
| 6,583,919 B1 | 6/2003 | Mizutani et al. | |
| 6,618,180 B2 | 9/2003 | Mochizuka | |
| 6,678,083 B1 | 1/2004 | Anstee | |
| 6,710,907 B2 | 3/2004 | Mochizuka et al. | |
| 6,746,775 B1 | 6/2004 | Boire et al. | |
| 6,747,779 B1 | 6/2004 | Morin et al. | |
| 6,795,226 B2 | 9/2004 | Agrawal et al. | |
| 6,800,355 B2 | 10/2004 | Wong | 428/141 |
| 6,819,467 B2 | 11/2004 | Lynam | |
| 6,825,965 B2 | 11/2004 | Minami et al. | |
| 6,867,893 B2 | 3/2005 | Patz et al. | |
| 6,871,967 B2 | 3/2005 | Fukazawa | |
| 6,926,786 B2 | 8/2005 | Frost et al. | 156/101 |
| RE38,959 E | 1/2006 | Kohli | 428/428 |
| 6,995,891 B2 | 2/2006 | Agrawal et al. | |
| 7,001,868 B2 | 2/2006 | Sawano | |
| 7,002,720 B2 | 2/2006 | Beteille et al. | |
| 7,012,735 B2 | 3/2006 | Honeyman et al. | |
| 7,033,655 B2 | 4/2006 | Beteille et al. | |
| 7,038,828 B2 | 5/2006 | Xu et al. | |
| 7,061,010 B2 | 6/2006 | Minakata | 257/40 |
| 7,110,157 B2 | 9/2006 | Beteille et al. | |
| 7,124,006 B2 | 10/2006 | Davidson et al. | 701/36 |
| 7,157,133 B2 | 1/2007 | Moran | 428/172 |
| 7,158,277 B2 | 1/2007 | Berggren et al. | |
| 7,160,624 B2 | 1/2007 | Fukatani et al. | 428/437 |
| 7,179,535 B2 | 2/2007 | Fisher | 428/437 |
| 7,214,455 B2 | 5/2007 | Miyoshi et al. | 430/18 |
| 7,230,748 B2 | 6/2007 | Giron et al. | |
| 7,236,292 B2 | 6/2007 | LeCain et al. | |
| 7,245,414 B2 | 7/2007 | Liang et al. | |
| 7,256,923 B2 | 8/2007 | Liu et al. | |
| 7,297,407 B2 | 11/2007 | Anderson | 428/441 |
| 7,312,914 B2 | 12/2007 | Shinozaki et al. | |
| 7,323,426 B2 | 1/2008 | Aitken | 501/63 |
| 7,379,225 B2 | 5/2008 | Tonar et al. | |
| 7,414,771 B2 | 8/2008 | Martin | |
| 7,428,090 B2 | 9/2008 | Fukazawa et al. | |
| 7,513,813 B2 | 4/2009 | Paolini, Jr. et al. | |
| 7,585,567 B2 | 9/2009 | Seto et al. | 428/432 |
| 7,602,542 B2 | 10/2009 | Tonar et al. | |
| 7,675,667 B2 | 3/2010 | Xu et al. | |
| 7,679,809 B2 | 3/2010 | Tonar et al. | |
| 7,710,671 B1 | 5/2010 | Kwak et al. | |
| 7,733,554 B2 | 6/2010 | Danner et al. | |
| 7,771,061 B2 | 8/2010 | Varaprasad et al. | |
| 7,777,933 B2 | 8/2010 | Piroux et al. | |
| 7,791,782 B2 | 9/2010 | Paolini, Jr. et al. | |
| 7,791,784 B2 | 9/2010 | Giron et al. | |
| 7,808,692 B2 | 10/2010 | Karmhag et al. | |
| 7,817,327 B2 | 10/2010 | Derda | |
| 7,839,564 B2 | 11/2010 | Whitesides et al. | |
| 7,869,114 B2 | 1/2011 | Valentin et al. | |
| 7,874,666 B2 | 1/2011 | Xu et al. | |
| 7,894,119 B2 | 2/2011 | Valentin et al. | |
| 7,894,120 B2 | 2/2011 | Valentin et al. | |
| 7,916,380 B2 | 3/2011 | Tonar et al. | |
| 7,929,194 B2 | 4/2011 | Legois et al. | |
| 7,952,785 B2 | 5/2011 | Karmhag et al. | |
| 7,957,053 B2 | 6/2011 | Honeyman et al. | |
| 7,988,885 B2 | 8/2011 | Percec et al. | |
| 8,102,587 B2 | 1/2012 | Bressand et al. | |
| 8,115,984 B2 | 2/2012 | Agrawal et al. | |
| 8,154,788 B2 | 4/2012 | Millett et al. | |
| 8,164,817 B2 | 4/2012 | Varaprasad et al. | |
| 8,164,818 B2 | 4/2012 | Collins et al. | |
| 8,200,390 B2 | 6/2012 | Brown et al. | |
| 8,218,224 B2 | 7/2012 | Kwak et al. | |
| 8,248,680 B2 | 8/2012 | Brown et al. | |
| 8,256,940 B2 | 9/2012 | Brown et al. | |
| 8,274,730 B2 | 9/2012 | Valentin et al. | |
| 8,284,472 B2 | 10/2012 | Yoshimura et al. | |
| 8,287,767 B2 | 10/2012 | Percec et al. | |
| 8,289,607 B2 | 10/2012 | Valentin et al. | |
| 8,289,609 B2 | 10/2012 | Lamine et al. | |
| 8,289,610 B2 | 10/2012 | Verrasamy | |
| 8,405,896 B2 | 3/2013 | Lamine et al. | |
| 8,405,901 B2 | 3/2013 | Boote | |
| 8,432,600 B2 | 4/2013 | Brown et al. | |
| 8,446,664 B2 | 5/2013 | Chen et al. | |
| 8,482,835 B2 | 7/2013 | LeCain et al. | |
| 8,482,837 B2 | 7/2013 | Sbar et al. | |
| 8,482,838 B2 | 7/2013 | Sbar et al. | |
| 8,506,096 B2 | 8/2013 | McCabe et al. | |
| 8,562,157 B2 | 10/2013 | Lynam | |
| 8,571,754 B2 | 10/2013 | Brown et al. | |
| 2002/0118437 A1 * | 8/2002 | Rukavina et al. | 359/275 |
| 2004/0028883 A1 | 2/2004 | Straub et al. | 428/209 |
| 2004/0141141 A1 | 7/2004 | Ota et al. | 349/153 |
| 2004/0229444 A1 | 11/2004 | Couillard et al. | 438/455 |
| 2005/0002081 A1 | 1/2005 | Beteille et al. | |
| 2005/0250639 A1 | 11/2005 | Siebers et al. | |
| 2006/0139726 A1 | 6/2006 | Kloeppner et al. | |
| 2006/0261447 A1 | 11/2006 | Seto et al. | 257/644 |
| 2006/0276322 A1 * | 12/2006 | Hasegawa et al. | 501/49 |
| 2007/0125684 A1 | 6/2007 | Biesmans et al. | 208/108 |
| 2007/0190340 A1 | 8/2007 | Coppola et al. | 428/432 |
| 2007/0223096 A1 | 9/2007 | O'Connor et al. | 359/584 |
| 2008/0006525 A1 | 1/2008 | Fanton | |
| 2008/0212160 A1 | 9/2008 | Fanton et al. | |
| 2009/0181203 A1 | 7/2009 | Valentin et al. | |
| 2010/0163107 A1 | 7/2010 | Sakamoto et al. | 136/259 |
| 2010/0172011 A1 | 7/2010 | Piroux et al. | |
| 2010/0208325 A1 | 8/2010 | Piroux et al. | |
| 2011/0094584 A1 | 4/2011 | Sawada et al. | 136/256 |
| 2011/0216389 A1 | 9/2011 | Piroux et al. | |

(56) References Cited

U.S. PATENT DOCUMENTS

| | | |
|---|---|---|
| 2011/0304899 A1 | 12/2011 | Kwak et al. |
| 2012/0134004 A1 | 5/2012 | Melcher et al. |
| 2012/0182593 A1 | 7/2012 | Collins et al. |
| 2012/0194895 A1 | 8/2012 | Podbelski et al. |
| 2012/0212794 A1 | 8/2012 | Giron et al. |
| 2012/0320330 A1 | 12/2012 | Brown et al. |
| 2012/0327499 A1 | 12/2012 | Parker et al. |
| 2013/0094073 A1 | 4/2013 | Ushigome |
| 2013/0222877 A1 | 8/2013 | Greer et al. |
| 2013/0258437 A1 | 10/2013 | Sbar et al. |
| 2013/0258438 A1 | 10/2013 | Sbar et al. |
| 2013/0278989 A1 | 10/2013 | Lam et al. |
| 2013/0286458 A1 | 10/2013 | Lamine et al. |

FOREIGN PATENT DOCUMENTS

| | | |
|---|---|---|
| DE | 2006042538 | 3/2008 |
| DE | 102006042538 | 3/2008 |
| EP | 0869105 | 10/1998 |
| EP | 2023435 | 2/2009 |
| GB | 2002344 | 2/1979 |
| JP | 1995287218 | 10/1995 |
| JP | 1998-1335 A | 1/1998 |
| JP | 101335 | 1/1998 |
| JP | 2000017956 | 1/2000 |
| JP | 2004112057 | 4/2004 |
| JP | 2004112057 A | 4/2004 |
| JP | 2006521228 | 9/2006 |
| WO | 2004/016897 | 2/2004 |
| WO | 2008/149793 | 12/2008 |
| WO | 2009/145876 | 12/2009 |
| WO | 2009/145909 | 12/2009 |

OTHER PUBLICATIONS

Abstract of WO2008/149793.
Abstract of DE10164273.
Machine translation of JP1995287218.
Machine translation of JP2006521228.
English translation of DE102006042538.
JP Office Action 184515.
Machine translation of JP2004112057.
Carmichael, D. C. et al; NASA Review; "Final Report: Review of World Experience and Properties of Materials for Encapsulation of Terrestial Photovoltaic Arrays;" Jul. 21, 1976; 196 pages.
KR20107029021 Office Action dated Sep. 30, 2015.
DuPont; DuPont™ Spallshied® Composite Product Information; DuPont™, The Miracle of Science™, Butacite® and Spallshied®; © 2006; pp. 1-4.
DuPont; Hurricane-Resistant Glazing Laminated Glass with DuPont™ SentryGlas® Interlayer; Oct. 28, 2014; pp. 1-7.

* cited by examiner

GLASS LAMINATED ARTICLES AND LAYERED ARTICLES

CROSS REFERENCES TO RELATED APPLICATIONS

This patent application is a continuation of U.S. application Ser. No. 12/427,397, filed Apr. 21, 2009, and claims the benefit of priority to U.S. Provisional Patent Application 61/057,344 filed on May 30, 2008.

BACKGROUND

1. Field

Embodiments of the invention relate to laminated articles and layered articles and more particularly to low alkali glass laminated articles and layered articles useful for, for example, electrochromic devices.

2. Technical Background

The management of natural light is a consideration in architectural design, for example, how to maximize the view of the outside while ensuring that the interior of the building is comfortable for the occupants. For example, too much light can increase the heat and/or brightness inside the building. Windows which can be switched from transparent to varying degrees of tinted and back to transparent, for example, electrochromic windows, are being developed to minimize one or more disadvantages associated with increased glass usage, for example, heat gain and glare.

Windows for use, for example, in automobiles and in architecture must meet several safety codes and are subject to mechanical strength tests, for example, debris impact tests and post-breakage wind cycling. Windows can benefit from increased mechanical strength, for example, in order to withstand environmental conditions.

Functional materials for electrochromic, photochromic, thermochromic, and low-e type applications are typically applied to a thick soda lime glass substrate, which is laminated to a second thick soda lime glass substrate in order to meet the above mentioned safety codes. The substrates are often coated with a barrier layer in order to minimize alkali, for example, sodium diffusion from the substrate into the functional materials. However, any breaks in the barrier layer, for example, scratches can allow sodium or alkalis to enter the functional material, compromising the utility of the functional material. Defects in the soda lime glass, for example, bubbles, scratches, inclusions can also compromise the utility of the functional material.

Glass strength can depend on exposure temperatures, aspect ratio, plate size, stiffness and load duration. Laminated glass can be made with annealed, heat strengthened, and/or fully tempered for additional benefits, such as resistance to increased wind loading, increased impact resistance or resistance to thermal stress.

It would be advantageous to have laminated articles and layered articles in which alkali diffusion such as sodium diffusion can be minimized and where mechanical strength and/or clarity can be maximized.

SUMMARY

Laminated articles and layered articles of the invention address one or more of the above-mentioned disadvantages of conventional laminated articles and layered articles and provide one or more of the following advantages: minimizing alkali diffusion, for example, sodium diffusion into the functional material from the glass, reduction of defects in the glass, increased clarity, and minimized weight.

One embodiment is an article comprising:
a glass layer having a coefficient of thermal expansion $50 \times 10^{-7}$/° C. or less;
a functional material disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a sodium oxide content of 10 percent by weight or less;
an electrochromic, a thermochromic, a photochromic, a low-e type, an actively defrosting, a transparent conductive oxide material, or a combinations thereof disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a coefficient of thermal expansion $50 \times 10^{-7}$° C. or less;
an electrochromic material disposed on the glass layer; and
a protective layer disposed on a surface of the electrochromic material not in contact with the glass layer.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Reference will now be made in detail to various embodiments of the invention, examples of which are illustrated in the accompanying drawings. Wherever possible, the same reference numbers will be used throughout the drawings to refer to the same or like parts.

Figure 1:
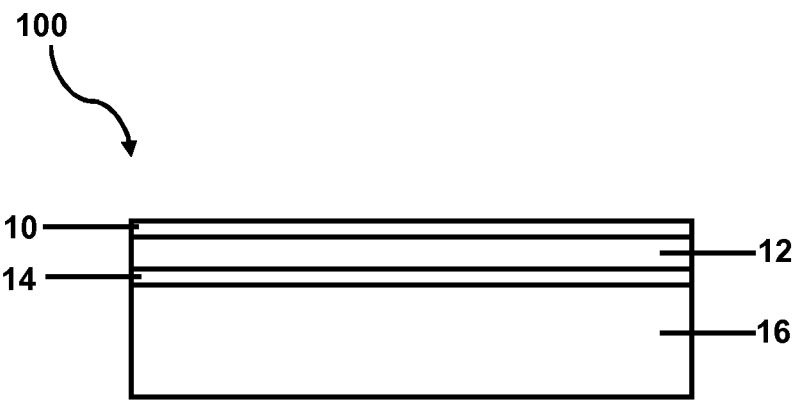
FIG. 1 is a schematic of an article according to one embodiment.
Figure 2:
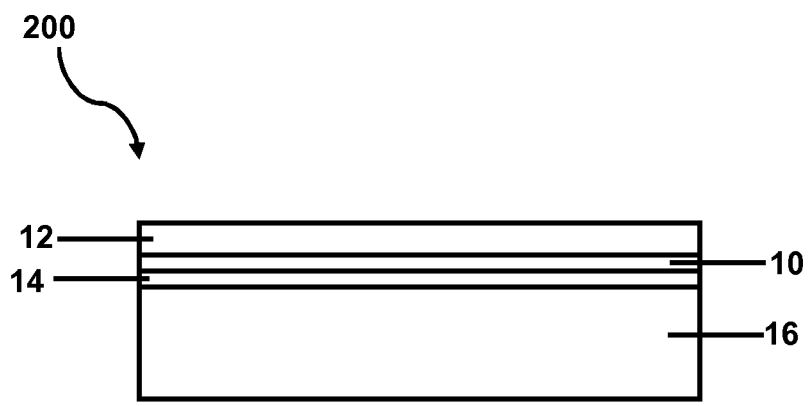
FIG. 2 is a schematic of an article according to one embodiment.

One embodiment, as shown in FIG. 1 and FIG. 2 is an article 100 and 200, respectively, comprising:
- a glass layer 12 having a coefficient of thermal expansion $50 \times 10^{-7}$/° C. or less;
- a functional material 10 disposed on the glass layer;
- a substrate 16 comprising a glass, a polymer, or a combination thereof, and having a thickness greater than that of the glass layer; and
- a laminate layer 14 disposed between the substrate and either the glass layer or functional material.

Another embodiment, is an article comprising:
- a glass layer having an alkali oxide content of 10 percent by weight or less;
- an electrochromic, a thermochromic, a photochromic, a low-e type, an actively defrosting, a transparent conductive oxide material, or a combination thereof disposed on the glass layer;
- a substrate comprising a glass, a polymer, or a combination thereof, and having a thickness greater than that of the glass layer; and
- a laminate layer disposed between the substrate and either the glass layer or functional material.

Another embodiment is an article comprising:
- a glass layer having a sodium oxide content of 10 percent by weight or less;
- an electrochromic, a thermochromic, a photochromic, a low-e type, an actively defrosting, a transparent conductive oxide material, or a combination thereof disposed on the glass layer;
- a substrate comprising a glass, a polymer, or a combination thereof, and having a thickness greater than that of the glass layer; and
- a laminate layer disposed between the substrate and either the glass layer or functional material.

Another embodiment is an article comprising:
- a glass layer having a coefficient of thermal expansion $50 \times 10^{-7}$/° C. or less;
- an electrochromic material disposed on the glass layer;
- a substrate comprising a glass, a polymer, or a combination thereof, and having a thickness greater than that of the glass layer; and
- a laminate layer disposed between the substrate and either the glass layer or functional material.

Another embodiment is an article comprising:
- a transparent glass layer having an alkali oxide content of 10 percent by weight or less, wherein the transparent glass layer has thickness of from 0.5 mm to 4 mm;
- an electrochromic material disposed on the transparent glass layer;
- a substrate comprising a glass, a polymer, or a combination thereof, and having a thickness greater than that of the transparent glass layer; and
- a laminate layer comprising a material selected from polyvinyl butyral, a UV curable resin, a thermoplastic, a thermoplastic ionoplast, polycarbonate, polyurethane, a UV curable polymer, silicone, and combinations thereof disposed between the substrate and either the transparent glass layer or functional material.

According to some embodiments, the glass layer has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass layer can have a thickness of any numerical value including decimal places in the range of from 0.1 mm up to and including 4.0 mm.

The glass layer can have a relatively low coefficient of thermal expansion (CTE), for example, $50 \times 10^{-7}$/° C. or less, for example, $35 \times 10^{-7}$/° C. or less. According to one embodiment, the glass layer has a CTE of $20 \times 10^{-7}$/° C. to $50 \times 10^{-7}$/° C., for example, $20 \times 10^{-7}$/° C. to $35 \times 10^{-7}$/° C.

The glass layer, in some embodiments, is transparent.

In one embodiment, the laminate layer comprises a material selected from polyvinyl butyral, a UV curable resin, a thermoplastic, a thermoplastic ionoplast, polycarbonate, polyurethane, a UV curable polymer, silicone, and combinations thereof.

The substrate, according to one embodiment comprises a glass, a polymer, or a combination thereof. For instance, the substrate can comprise a material selected from float glass, fusion formable glass, soda lime glass, plastic, polycarbonate, and combinations thereof.

The electrochromic, thermochromic, photochromic, low-e type, actively defrosting, or transparent conductive oxide material can comprise a single layer or multiple layers. The electrochromic functional material can comprise multiple layers such as an electrode layer or layers, a counter electrode layer or layers, an ion conducting layer or layers. The layers, in some embodiments, can comprise solid inorganic materials.

The glass layer, according to one embodiment, comprises an alkali oxide content of 10 percent by weight or less, for example, 9 percent or less, for example, 8 percent or less, for example, 5 percent or less, for example, 0.5 percent or less. In one embodiment, the alkali oxide content is in the range of from 0.1 percent to 10 percent. Although these are exemplary alkali oxide contents, the glass layer can have alkali oxide contents of any numerical value including decimal places in the range of from 0 up to and including 10 percent by weight.

The glass layer, according to one embodiment, comprises a sodium oxide content of 10 percent by weight or less, for example, 9 percent or less, for example, 8 percent or less, for example, 5 percent or less, for example, 0.5 percent or less. In one embodiment, the sodium oxide content is in the range of from 0.1 percent to 10 percent by weight. Although these are exemplary sodium oxide contents, the glass layer can have sodium oxide contents of any numerical value including decimal places in the range of from 0 up to and including 10 percent by weight.

According to some embodiments, the configuration of the article can be, for example, those described by FIG. 1 and FIG. 2, however, other configurations can be used in accordance with the invention. For example, the laminate layer, can be disposed between the substrate and either the glass layer or functional material.

Figure 3:
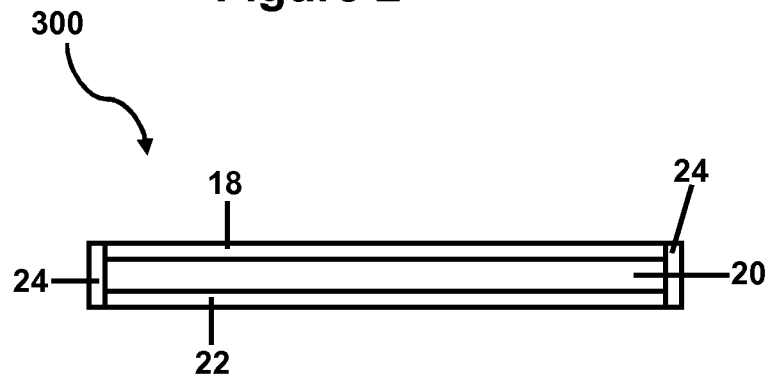
FIG. 3 is a schematic of an article according to one embodiment.

Another embodiment as shown in FIG. 3 is an article 300 comprising a glass layer 18 having a glass layer having a coefficient of thermal expansion $50 \times 10^{-7}$/° C. or less; an electrochromic material 20 disposed on the glass layer; and a protective layer 22 disposed on a surface of the electrochromic material not in contact with the glass layer. The article, according to one embodiment, further comprises a seal material 24 joining the protective layer and the glass layer such that the combination of the protective layer, the glass layer, and the seal material together enclose the electrochromic material. The seal material can be selected from a frit, a glass sheet, and a sputtered glass. The seal material in combination with the protective layer and the glass layer can minimize deleterious effects of exposing the electrochromic material to the environment, for example, during shipping, manufacturing of a window, and/or in the final product such as a window in a building or in an automobile.

In this embodiment, the electrochromic material can comprise multiple layers such as an electrode layer or layers, a counter electrode layer or layers, an ion conducting layer or layers. The layers, in some embodiments, can comprise solid inorganic materials.

In this embodiment, the glass layer can have a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass layer can have a thickness of any numerical value including decimal places in the range of from 0.1 mm up to and including 4.0 mm.

The glass layer can have a relatively low coefficient of thermal expansion (CTE), for example, $50 \times 10^{-7}/°$ C. or less, for example, $35 \times 10^{-7}/°$ C. or less. According to one embodiment, the glass layer has a CTE of $20 \times 10^{-7}/°$ C. to $50 \times 10^{-7}/°$ C., for example, $20 \times 10^{-7}/°$ C. to $35 \times 10^{-7}/°$ C.

The glass layer, in some embodiments, is transparent.

The protective layer can provide chemical or mechanical durability. The protective layer can be a sputtered glass layer or a sheet of glass, for example, a transparent glass layer or sheet. The protective layer, according to some embodiments, has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the protective layer can have a thickness of any numerical value including decimal places in the range of from 0.1 mm up to and including 4.0 mm.

The protective layer can have a relatively low coefficient of thermal expansion (CTE), for example, $50 \times 10^{7}/°$ C. or less, for example, $35 \times 10^{-7}/°$ C. or less. According to one embodiment, the protective layer has a CTE of $20 \times 10^{-7}/°$ C. to $50 \times 10^{-7}/°$ C., for example, $20 \times 10^{-7}/°$ C. to $35 \times 10^{-7}/°$ C.

The protective layer, in some embodiments, is transparent.

In some embodiments, the electrochromic material can comprise multiple layers such as an electrode layer or layers, a counter electrode layer or layers, an ion conducting layer or layers. The layers, in some embodiments, can comprise solid inorganic materials.

Laminating thin, low CTE, low alkali glass coated with a functional material to thick soda lime glass enables process improvements and can minimize costs. Low CTE, low alkali glass is durable, has increased clarity as compared to soda lime glass, and can be made with minimal defects, for example, in display glass applications for televisions.

In architectural windows, commercially available windows are typically 6 mm thick. According to the present invention, 0.7 mm to 1.1 mm low CTE, low alkali glass can be laminated to a less than 6 mm soda lime glass using a polyvinyl butyral laminate by one of a number of laminating processes. The soda lime glass could be annealed, heat strengthened (HS) and/or fully tempered (FT) depending on the strength required to meet relevant transportation or building codes.

In this example, the soda lime glass provides a strength benefit in that it can be annealed, heat strengthened (typically 2× strength of annealed glass) and/or fully tempered (typically 4× strength of annealed glass) to provide additional mechanical strength that may be required by transportation or building codes. Low CTE low alkali glass is typically available only in annealed form, thus the substrate, in this example, the soda lime glass provides the increased strength of the laminated article.

The glass layer, according to the invention, provides one or more of the following advantages: low alkali glass reduces the need for a barrier layer on soda lime glass in order to minimize sodium/alkali diffusion; low alkali glass enhances the performance of organic or inorganic coating, for example, electrochromic, thermochromic, photochromic, low-e; low alkali glass can be processed at high temperatures; low alkali glass can be cut after coating. Thin low alkali glass is light weight and minimizes the cost associated with a low CTE, low alkali product.

Lamination can provide one or more of the following advantages safety, security, sound reduction, UV control, weather/natural disaster benefit, durability, design versatility, installation ease, and low visual distortion. Lamination can be used to laminate a thin, low alkali glass to various substrates. This can be useful in tailoring other properties, for instance, color or self-cleaning properties.

The laminated articles and layered articles of the invention can be used, for example, for electrochromic windows for general transportation (cars, trains, light rail, airplanes, buses), buildings (commercial and residential), and for PV cells both for buildings (commercial and residential), and on-off grid.

The laminated articles and layered articles can be incorporated as the outer, center or inner pane of a single pane, double pane, or triple pane window, for example.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. An architectural window comprising:
    at least a double pane window comprising a first pane and a second pane;
    the first pane comprising a glass sheet; and
    the second pane comprising no more than two glass layers,
      the first glass layer comprising:
        a first face and a second face;
        a coefficient of thermal expansion from $20 \times 10^{-7}$/C to $35 \times 10^{-7}/°$ C.;
        an alkali oxide content of 10 percent by weight or less;
        and
        a thickness of 2.5 mm or less;
      the second glass layer comprising a substrate comprising a soda lime glass and having a thickness greater than that of the first glass layer; and
    the second pane further comprising:
      a solid inorganic electrochromic material disposed on the first face of the first glass layer; and
      a laminate layer disposed on the second face of the first glass layer, between the substrate and the first glass layer.

2. The architectural window of claim 1, wherein the alkali oxide content is 5 percent by weight or less.

3. The architectural window of claim 2, wherein the alkali oxide content is 0.5 percent by weight or less.

4. The architectural window of claim 1, wherein the alkali oxide is sodium oxide.

5. The architectural window of claim 1, wherein the substrate comprises an annealed, heat strengthened, or fully tempered soda lime glass.

6. The architectural window of claim 1, wherein the substrate is less than 6 mm thick.

7. The architectural window of claim 1, wherein the article does not comprise a barrier layer.

8. The architectural window of claim 1, further comprising a laminate layer comprising a material selected from polyvinyl butyral, a UV curable resin, a thermoplastic, a thermoplastic ionoplast, polycarbonate, polyurethane, a UV curable polymer, silicone, and combinations thereof disposed between the substrate and either the transparent glass layer or functional material.

9. The architectural window of claim 1, wherein the solid inorganic electrochromic material comprises an electrode layer, a counter-electrode layer, and an ion-conducting layer.

10. An architectural window comprising:
a glass layer comprising:
 a first face and a second face;
 a coefficient of thermal expansion from $20 \times 10^{-7}$/C to $35 \times 10^{-7}$/° C.;
 an alkali oxide content of 10 percent by weight or less; and
 a thickness of 2.5 mm or less;
a solid inorganic electrochromic material disposed on the first face of the glass layer;
a substrate comprising a soda lime glass and having a thickness greater than that of the glass layer;
a laminate layer disposed on the second face of the glass layer, between the substrate and the glass layer, and
wherein the architectural window is at least double pane.

11. The architectural window of claim 10, wherein the alkali oxide content is 5 percent by weight or less.

12. The architectural window of claim 11, wherein the alkali oxide content is 0.5 percent by weight or less.

13. The architectural window of claim 10, wherein the alkali oxide is sodium oxide.

14. The architectural window of claim 10, wherein the substrate comprises an annealed, heat strengthened, or fully tempered soda lime glass.

15. The architectural window of claim 14, wherein the substrate is less than 6 mm thick.

16. The architectural window of claim 10, wherein the article does not comprise a barrier layer.

17. The architectural window of claim 10, further comprising a laminate layer comprising a material selected from polyvinyl butyral, a UV curable resin, a thermoplastic, a thermoplastic ionoplast, polycarbonate, polyurethane, a UV curable polymer, silicone, and combinations thereof disposed between the substrate and either the transparent glass layer or functional material.

18. The architectural window of claim 10, wherein the solid inorganic electrochromic material comprises an electrode layer, a counter-electrode layer, and an ion-conducting layer.

19. A method of making the article of claim 1 or claim 10, comprising:
 coating the glass layer with the solid inorganic electrochromic material;
 laminating the glass layer and substrate; and
 cutting the glass layer after coating.

20. The method of claim 19, wherein the alkali oxide content is 5 percent by weight or less.

21. The method of claim 20, wherein the alkali oxide content is 0.5 percent by weight or less.

22. The method of claim 19, wherein the alkali oxide is sodium oxide.

23. The method of claim 19, wherein the substrate comprises an annealed, heat strengthened, or fully tempered soda lime glass.

24. The method of claim 23, wherein the substrate is less than 6 mm thick.

25. The method of claim 19, wherein the article does not comprise a barrier layer.

26. The method of claim 19, wherein the substrate and glass layer are laminated via a laminate layer comprising a material selected from polyvinyl butyral, a UV curable resin, a thermoplastic, a thermoplastic ionoplast, polycarbonate, polyurethane, a UV curable polymer, silicone, and combinations thereof disposed between the substrate and either the transparent glass layer or functional material.

* * * * *